US009269898B2

(12) United States Patent
Maxwell et al.

(10) Patent No.: US 9,269,898 B2
(45) Date of Patent: Feb. 23, 2016

(54) LOW TEMPERATURE DEPOSITION FOR SILICON-BASED CONDUCTIVE FILM

(71) Applicant: Crossbar, Inc., Santa Clara, CA (US)

(72) Inventors: Steven Patrick Maxwell, Sunnyvale, CA (US); Kuk-Hwan Kim, Santa Clara, CA (US); Sung Hyun Jo, Sunnyvale, CA (US)

(73) Assignee: Crossbar, Inc., Santa Clara, CA (US)

( * ) Notice: Subject to any disclaimer, the term of this patent is extended or adjusted under 35 U.S.C. 154(b) by 0 days.

(21) Appl. No.: 14/341,723

(22) Filed: Jul. 25, 2014

(65) Prior Publication Data

US 2015/0228894 A1 Aug. 13, 2015

Related U.S. Application Data

(60) Provisional application No. 61/937,408, filed on Feb. 7, 2014.

(51) Int. Cl.
*H01L 45/00* (2006.01)
*H01L 27/24* (2006.01)

(52) U.S. Cl.
CPC ........ *H01L 45/1253* (2013.01); *H01L 45/1206* (2013.01); *H01L 45/16* (2013.01); *H01L 27/2409* (2013.01); *H01L 27/249* (2013.01); *H01L 27/2472* (2013.01); *H01L 45/04* (2013.01); *H01L 45/14* (2013.01); *H01L 45/1608* (2013.01)

(58) Field of Classification Search
CPC ............ H01L 27/2409; H01L 27/2472; H01L 27/249; H01L 45/1608; H01L 45/04; H01L 45/14
See application file for complete search history.

(56) References Cited

U.S. PATENT DOCUMENTS 6,965,137 B2 * 11/2005 Kinney et al. ................ 257/295
7,932,505 B2 * 4/2011 Sawa et al. ........................ 257/2
8,143,092 B2 * 3/2012 Kumar et al. ................ 438/104
8,242,478 B2 * 8/2012 Sakamoto ......................... 257/2
8,318,534 B2 * 11/2012 Gorer et al. .................. 438/104
8,558,211 B2 * 10/2013 Sakamoto et al. ................ 257/4
8,772,749 B2 * 7/2014 Sekar et al. ...................... 257/4
8,835,310 B2 * 9/2014 Barabash et al. ............ 438/648
8,866,118 B2 * 10/2014 Nardi et al. ....................... 257/2
8,921,960 B2 * 12/2014 Yang et al. .................... 257/421
9,029,825 B2 * 5/2015 Tada et al. ......................... 257/4
2010/0155687 A1 * 6/2010 Reyes et al. ....................... 257/4
2012/0235112 A1 * 9/2012 Huo et al. .......................... 257/4
2013/0099187 A1 * 4/2013 Pickett et al. ..................... 257/2
2013/0106930 A1 * 5/2013 Lea et al. .......................... 347/9
2013/0134379 A1 * 5/2013 Lu ..................................... 257/4
2014/0091270 A1 * 4/2014 Yang et al. ........................ 257/4
2014/0247648 A1 * 9/2014 Yoon ............................ 365/148

(Continued)

*Primary Examiner* — Ida M Soward
(74) *Attorney, Agent, or Firm* — Amin, Turocy & Watson, LLP

(57) ABSTRACT

Providing for low temperature deposition of silicon-based electrical conductor for solid state memory is described herein. In various disclosed embodiments, the silicon-based conductor can form an electrode of a memory cell, an interconnect between conductive components of an electronic device, a conductive via, a wire, and so forth. Moreover, the silicon-based electrical conductor can be formed as part of a monolithic process incorporating complementary metal oxide semiconductor (CMOS) device fabrication. In particular embodiments, the silicon-based electrical conductor can be a p-type silicon germanium compound, that is activated upon deposition at temperatures compatible with CMOS device fabrication.

20 Claims, 12 Drawing Sheets

(56) References Cited

U.S. PATENT DOCUMENTS

2014/0269002 A1* 9/2014 Jo .................................. 365/148
2014/0284538 A1* 9/2014 Chen et al. ......................... 257/2
2014/0293676 A1* 10/2014 Lee et al. ...................... 365/148
2014/0299832 A1* 10/2014 Jameson ........................... 257/4
2014/0374240 A1* 12/2014 Pham et al. .............. 204/192.12
2015/0021538 A1* 1/2015 Jo et al. ............................. 257/2
2015/0034898 A1* 2/2015 Wang et al. ........................ 257/4
2015/0060753 A1* 3/2015 Hsueh et al. ....................... 257/4
2015/0176122 A1* 6/2015 Hsueh et al. ....................... 257/4
2015/0249096 A1* 9/2015 Lupino et al. ................. 257/763

* cited by examiner

DOPED SILICON CONDUCTOR
300

400

| SAMPLE IN-SITU LOW TEMPERATURE DOPING PARAMETER 402 | APPROXIMATE SAMPLE VALUE 404 | APPROXIMATE SAMPLE RANGE 406 | |
|---|---|---|---|
| Chamber Temperature | 430C | 450C | 410C |
| Chamber Pressure (e.g., for seed/nucleation film deposition | 400mT | 800mT | 100mT |
| Seed Material Flow (e.g., $SiH_4$ seed/nucleation film deposition) | 50sccm | 20sccm | 300sccm |
| Chamber Pressure (e.g., for p-type SiGe film deposition) | 400mT | 800mT | 200mT |
| Seed Material Flow (e.g., $SiH_4$ for p-type SiGe film deposition) | 75sccm | 150sccm | 35sccm |
| $BCl_3$ Flow (e.g., for p-type SiGe film deposition) | 30sccm | 60sccm | 15sccm |
| $GeH_4$ Flow (e.g., for p-type SiGe film deposition) | 250sccm | 500sccm | 100sccm |
| Resistance (Ohm; 2-point probe) | <1000ohm | N/A | N/A |
| Sheet Rho (Ohm/sq; 4-point probe) | 50ohm/sq | 250ohm/sq | N/A |
| Sheet Resistance (Ohm-cm; for 3000A° thick film) | 0.005 ohm-cm | 0. 01 ohm-cm | N/A |

FIG. 4

LOW TEMPERATURE DEPOSITION FOR SILICON-BASED CONDUCTIVE FILM

CROSS-REFERENCE TO RELATED APPLICATIONS

The present application for patent claims the benefit of U.S. Provisional Application Ser. No. 61/937,408, entitled LOW TEMPERATURE DEPOSITION FOR SILICON-BASED CONDUCTIVE FILM and filed Feb. 7, 2014, which is incorporated by reference herein in its entirety and for all purposes.

TECHNICAL FIELD

This disclosure relates generally to electronic memory; for example, the disclosure describes a silicon based conductive material for use in conjunction with electronic memory.

BACKGROUND

Resistive memory devices represent a recent innovation within the field of integrated circuit technology. While much of this technology is in the development stages, various technological concepts for proposed resistive memory devices and fabrication of the same have been demonstrated by the inventors. The inventors believe that various resistive memory technologies and various techniques for fabricating various resistive memory devices show compelling evidence to hold substantial advantages over competing technologies in the semiconductor electronics industry.

Over time, advancement in technology has provided an increase in a number of semiconductor devices, such as transistors, that can be fabricated on a given geometric area of a semiconductor chip. An implication of increasing the number of semiconductor devices is increasing memory capacity and processing power for the semiconductor chip and associated electronic devices.

In light of the above, the inventors desire to continue developing practical utilization and fabrication of resistive memory technology.

SUMMARY

The following presents a simplified summary of the specification in order to provide a basic understanding of some aspects of the specification. This summary is not an extensive overview of the specification. It is intended to neither identify key or critical elements of the specification nor delineate the scope of any particular embodiments of the specification, or any scope of the claims. Its purpose is to present some concepts of the specification in a simplified form as a prelude to the more detailed description that is presented in this disclosure.

Aspects of the subject disclosure provide for low temperature deposition in conjunction with formation of a silicon based conductor. The silicon based conductor can be employed in conjunction with a two-terminal memory cell for solid state electronics. For instance, the silicon based conductor can form an electrode of a two-terminal memory cell, an interconnect between conductive components of an electronic device, a conductive via, a wiring, a component of the foregoing, or the like, or a suitable combination thereof.

In additional aspects of the subject disclosure, there is provided a low temperature deposition process for a silicon component of a memory device. The low temperature deposition process can comprise a p-type dopant provided for a silicon germanium film. The deposition process can result in activation of the p-type dopant concurrent with depositing the p-type dopant, resulting in a conductive, p-type SiGe film. Moreover, this activation can be accomplished while avoiding high-temperature annealing associated with other activation processes.

In one or more disclosed embodiments, there is provided an in-situ low temperature p-type deposition process for a SiGe film that is compatible with complementary metal-oxide semiconductor (CMOS) fabrication techniques. In at least one aspect, the p-type dopant can comprise Boron, or the like. A resulting Boron doped SiGe film can serve as a conductor or conductive film for a memory device. The conductor or conductive film can be implemented as an electrode of a memory cell, an interconnect or via of a memory device, a conductive interface between an interconnect or via and another component of the memory cell, or a wire or component of a wire of the memory device, or the like, or a suitable combination thereof.

In one or more further embodiments, a disclosed low temperature deposition process can comprise a seed layer. The seed layer can be provided as part of a deposition process (e.g., chemical vapor deposition, low pressure chemical vapor deposition, etc.) in advance of depositing a doped silicon-based material. In at least one aspect, the seed layer can be provided at relatively low temperatures that are compatible with CMOS fabrication techniques. In various embodiments, the seed layer can comprise silane (e.g., $SiH_4$). In alternative or additional embodiments, the seed layer can be selected to facilitate activation of the doped silicon-based material in conjunction with the depositing thereof. Accordingly, a separate activation process (e.g., annealing, etc.) in addition to the depositing can be avoided, facilitating formation of a conductive silicon-based material at relatively low temperatures (e.g., in a range between 400 and 450 degrees Celsius).

In alternative or additional embodiments, the present disclosure provides a method. The method can comprise providing a substrate for an electronic memory. In addition, the method can comprise forming a seed layer comprising a seed layer material over the substrate. Moreover, the method can comprise forming a conductive silicon and germanium containing material over the seed layer using a silicon and germanium containing precursor and p-type dopant at a deposition temperature lower than about 450 degrees Celsius, wherein the seed layer material can facilitate crystallization of the conductive silicon and germanium containing material. In other embodiments, the p-type dopant can be activated within the conductive silicon and germanium containing material concurrent with forming the conductive silicon and germanium containing material.

In another embodiment, there is provided a memory cell. The memory cell can comprise a first electrode, and a switching layer positioned adjacent to the first electrode and configured to switch between a first state and a second state in response to a first signal and a second signal, respectively, applied to the memory cell. In addition to the foregoing, the memory cell can comprise a second electrode adjacent the switching layer. In various embodiments, the first electrode can be comprised of a p-type doped silicon compound that is activated at a temperature no greater than 450 degrees Celsius.

In still other embodiments, the subject disclosure provides a memory device. The memory device can comprise a substrate and a complementary metal oxide semiconductor (CMOS) circuit formed at least in part within the substrate. In addition, the memory device can comprise a two-terminal memory cell comprising a silicon-based conductive film, wherein the two-terminal memory cell and the silicon-based conductive film are formed as part of a monolithic fabrication process with the CMOS circuit, and further wherein the silicon-based conductive film is a p-type SiGe material.

The following description and the drawings set forth certain illustrative aspects of the specification. These aspects are indicative, however, of but a few of the various ways in which the principles of the specification may be employed. Other advantages and novel features of the specification will become apparent from the following detailed description of the specification when considered in conjunction with the drawings.

BRIEF DESCRIPTION OF THE DRAWINGS

Numerous aspects, embodiments, objects, and advantages of the instant invention will be apparent upon consideration of the following detailed description, taken in conjunction with the accompanying drawings, in which like reference characters refer to like parts throughout. In this specification, numerous specific details are set forth in order to provide a thorough understanding of this disclosure. It should be understood, however, that certain aspects of the subject disclosure may be practiced without these specific details, or with other methods, components, materials, etc. In other instances, well-known structures and devices are shown in block diagram form to facilitate describing the subject disclosure.

FIG. 4 depicts an example chart of process parameters and example values and ranges for low temperature deposition described by various disclosed aspects.

DETAILED DESCRIPTION

Figure 1:
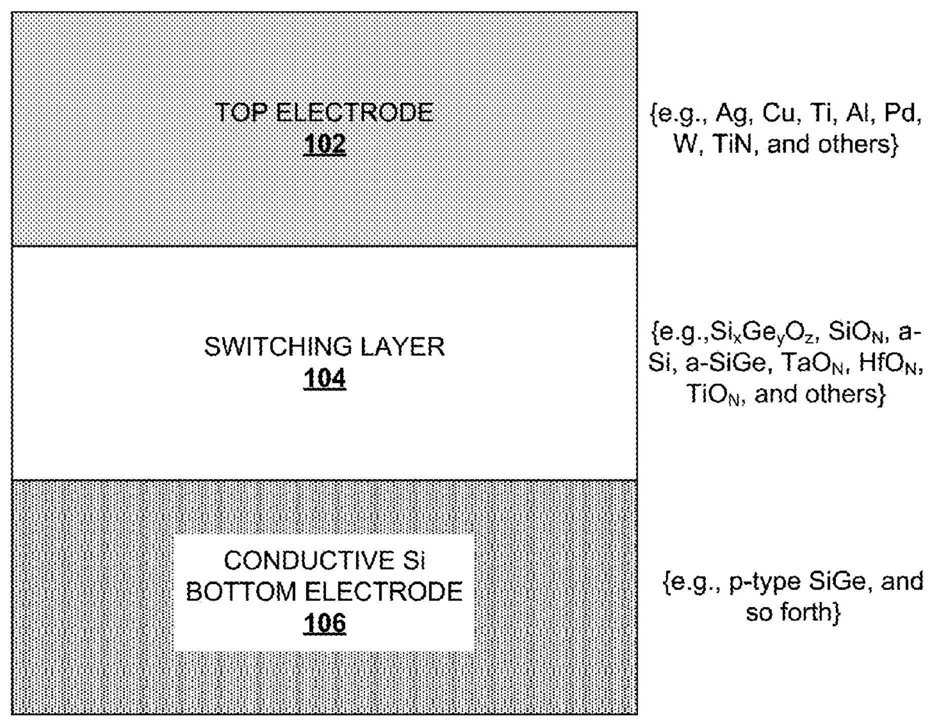
FIG. 1 depicts a block diagram of a cross-sectional view of a monolithic memory cell stack according to one or more aspects of the subject disclosure.

This disclosure relates to two-terminal memory cells employed for digital information storage. In some embodiments, the two-terminal memory cells can include a resistive technology, such as a resistive-switching two-terminal memory cell. Resistive-switching two-terminal memory cells (also referred to as resistive-switching memory cells or resistive-switching memory), as utilized herein, comprise circuit components having conductive contacts with an active region between the two conductive contacts. The active region of the two-terminal memory device, in the context of resistive-switching memory, exhibits a plurality of stable or semi-stable resistive states, each resistive state having a distinct electrical resistance. Moreover, respective ones of the plurality of states can be formed or activated in response to a suitable electrical signal applied at the two conductive contacts. The suitable electrical signal can be a voltage value, a current value, a voltage or current polarity, or the like, or a suitable combination thereof. An example of a resistive switching two-terminal memory device, though not exhaustive, can include a resistive random access memory (RRAM).

Embodiments of the subject disclosure can provide a filamentary-based memory cell. One example of a filamentary-based memory cell can comprise: a p-type or n-type silicon (Si) bearing layer (e.g., p-type or n-type polysilicon, p-type or n-type SiGe, etc.), a resistive switching layer (RSL) and an active metal layer capable of being ionized. Under suitable conditions, the active metal layer can provide filament forming ions to the RSL. The p-type or n-type Si bearing layer can include a p-type or n-type polysilicon, p-type or n-type SiGe, or the like. The RSL (which can also be referred to in the art as a resistive switching media (RSM)) can comprise, e.g., an undoped amorphous Si layer, a semiconductor layer having intrinsic characteristics, a Si sub-oxide (e.g., SiOx wherein x has a value between 0.1 and 2), metallic oxide (e.g. Zinc Oxide) and so forth. Other examples of materials suitable for the RSL could include $Si_XGe_YO_Z$ (where X, Y and Z are respective suitable positive integers), a silicon oxide (e.g., $SiO_N$, where N is a suitable positive integer), amorphous Si (a-Si), amorphous SiGe (a-SiGe), $TaO_B$ (where B is a suitable positive integer), $HfO_C$ (where C is a suitable positive integer), $TiO_D$ (where D is a suitable positive integer), and so forth, or a suitable combination thereof. Examples of the active metal layer can include, among others: silver (Ag), gold (Au), titanium (Ti), titanium-nitride (TiN) or other suitable compounds of titanium, nickel (Ni), copper (Cu), aluminum (Al), chromium (Cr), tantalum (Ta), iron (Fe), manganese (Mn), tungsten (W), vanadium (V), cobalt (Co), platinum (Pt), and palladium (Pd). Other suitable conductive materials, as well as compounds or combinations of the foregoing or similar materials can be employed for the active metal layer in some aspects of the subject disclosure. Some details pertaining to embodiments of the subject disclosure similar to the foregoing example(s) can be found in the following U.S. patent applications that are licensed to the assignee of the present application for patent: application Ser. No. 11/875,541 filed Oct. 19, 2007 and application Ser. No. 12/575,921 filed Oct. 8, 2009, each of which are incorporated by reference herein in their respective entireties and for all purposes.

To program a filamentary-based resistive switching memory cell, a suitable program voltage can be applied across the memory cell causing a conductive path or a filament to form through a relatively high resistive portion of the memory cell. This causes the memory cell to switch from a relatively high resistive state, to a relatively low resistive state. In some resistive-switching devices, an erase process can be implemented to deform the conductive filament, at least in part, causing the memory cell to return to the high resistive state from the low resistive state. This change of state, in the context of memory, can be associated with respective states of a binary bit. For an array of multiple memory cells, a word(s), byte(s), page(s), block(s), etc., of memory cells can be programmed or erased to represent zeroes or ones of binary information, and by retaining those states over time in effect storing the binary information In various embodiments, multi-level information (e.g., multiple bits) may be stored in such memory cells.

It should be appreciated that various embodiments herein may utilize a variety of memory cell technologies, having different physical properties. For instance, different resistive-switching memory cell technologies can have different discrete programmable resistances, different associated program/erase voltages, as well as other differentiating characteristics. For instance, various embodiments of the subject disclosure can employ a bipolar switching device that exhibits a first switching response (e.g., programming to one of a set of program states) to an electrical signal of a first polarity and a second switching response (e.g., erasing to an erase state) to the electrical signal having a second polarity. The bipolar switching device is contrasted, for instance, with a unipolar device that exhibits both the first switching response (e.g., programming) and the second switching response (e.g., erasing) in response to electrical signals having the same polarity and different magnitudes.

Where no specific memory cell technology or program/erase voltage is specified for the various aspects and embodiments herein, it is intended that such aspects and embodiments incorporate any suitable memory cell technology and be operated by program/erase voltages appropriate to that technology, as would be known by one of ordinary skill in the art or made known to one of ordinary skill by way of the context provided herein. It should be appreciated further that where substituting a different memory cell technology would require circuit modifications that would be known to one of ordinary skill in the art, or changes to operating signal levels that would be known to one of such skill, embodiments comprising the substituted memory cell technology(ies) or signal level changes are considered within the scope of the subject disclosure.

The inventors of the subject application are familiar with additional non-volatile, two-terminal memory structures. For example, ferroelectric random access memory (RAM) is one example. Some others include magneto-resistive RAM, organic RAM, phase change RAM and conductive bridging RAM, and so on. Two-terminal memory technologies have differing advantages and disadvantages, and trade-offs between advantages and disadvantages are common. For instance, various subsets of these devices can have relatively fast switching times, good durability, high memory density, low cost fabrication, long life, or the like, or combinations thereof. Meanwhile, the various subsets can also be difficult to fabricate, have compatibility problems with many common CMOS fabrication processes, poor read performance, small on/off resistance ratios, small on/off resistance ratios (e.g., leading to small sensing margin) or poor thermal stability, as well as other problems. Though resistive-switching memory technology is considered by the inventors to be one of the best technologies having the most benefits and least detriments, other two-terminal memory technologies can be utilized for some of the disclosed embodiments, where suitable to one of ordinary skill in the art.

The inventors of the present disclosure are of the opinion that two-terminal memory devices can be integrated with complementary metal oxide semiconductor (CMOS) devices on a silicon wafer. The CMOS devices can be configured, for instance, to drive a circuit, control or configure current or voltage sources, measure electrical characteristics, control device switching, and other functions. Two-terminal memory devices formed in a two or three dimensional array can provide storage of digital information, for example. The inventors are aware of proposals to integrate CMOS devices with two-terminal memory arrays by first building the CMOS devices on a silicon wafer, separately fabricating an array(s) of two-terminal memory elements, and subsequently integrating the CMOS devices and silicon wafer with the array(s) of two-terminal memory elements. According to these proposals, the CMOS devices are connected to subsets of the array of memory elements utilizing one or more layers of interconnects above the CMOS devices. These interconnects are often made of Aluminum (Al), Copper (Cu), or other metals with relatively low melt or softening temperatures. However, when utilizing silicon based conductive components for the memory elements, the proposals employ a silicon layer or film doped with a dopant and then activated to make the silicon film electrically conductive. In various cases, these proposals utilize a high temperature (e.g., <750 degrees Celsius) annealing process to activate the dopant. The inventors understand that these high temperatures can prevent in-situ activation of the dopant on a CMOS substrate having metals with relatively low thermal capacity. Accordingly, various embodiments of the subject disclosure provide a low temperature doping process that facilitates activation of a doped silicon film. In one or more embodiments, the doping process can be monolithically integrated with CMOS device fabrication, significantly simplifying fabrication of two-terminal memory arrays with CMOS devices on a silicon wafer.

Referring now to the drawings, FIG. 1 illustrates a block diagram of an example memory cell 100 utilizing a low temperature doping process for silicon-based conductive components. Memory cell 100 can comprise a top electrode 102, a switching layer 104 and a conductive silicon-based bottom electrode 106. One or more additional layers, not specifically depicted, can be included in memory cell 100 according to alternative embodiments.

Top electrode 102 can comprise an electrical conductor. Suitable electrical conductors can include, for example, metals, or conductively doped semiconductors. Top electrode 102 can comprise Ag, Au, Ti, TiN or other suitable compounds of titanium, Ni, Cu, Al, Cr, Ta, Fe, Mn, W, V, Co, Pt, or Pd, or the like, or suitable compounds of the foregoing, or suitable combinations thereof. In at least one embodiment, top electrode 102 can comprise a metal material suitable to produce ions at an interface of top electrode 102 and switching layer 104 in response to an electric field across memory cell 100. In one or more embodiments, top electrode 102 can comprise an elemental metal that is free of an ionically bonded material.

Switching layer 104 can comprise a material that is electrically resistive. For example, switching layer 104 can be electrically resistive relative to top electrode 102, or compared to silicon-based bottom electrode 106. Additionally, switching layer 104 can be at least in part permeable to ions produced by top electrode 102. In response to a suitable electric field, ions of top electrode 102 can migrate within or through switching layer 104. In at least one embodiment, ions of top electrode 102 can form within switching layer 104 in response to a suitable electric field. The migration or formation of ions can serve to provide a relatively low resistance region at least in part through switching layer 104, between top electrode 102 and silicon-based bottom electrode 106. According to some embodiments, ions forming the relatively low resistance region can at least in part deform in response to a suitable deformation field (e.g., an erase signal) applied to memory cell 100. Such deformation can return switching layer 104 to a relatively high resistance state. In terms of digital memory, the relatively low resistance state (e.g., in response to the suitable electric field) and relatively high resistance state (e.g., in response to the suitable deformation field) can represent a digital bit of information for digital memory storage.

According to further embodiments, switching layer 104 can be formed of one or more suitable materials having relatively high electrical resistance and at least in part permeable to ions produced by top electrode 102. Examples of such materials can include an undoped amorphous Si, a semiconductor layer having suitable intrinsic characteristics, a Si sub-oxide (e.g., $SiO_x$ where x has a value between 0.1 and 2), a metallic oxide (e.g., zinc oxide), or the like. For instance, switching layer 104 can be comprised of Si, a suitable silicon oxide, a $Si_XGe_YO_Z$ (where X, Y, and Z are suitable positive numbers), a-Si, amorphous SiGe (a-SiGe), $TaO_N$, $HfO_N$, $TiO_N$, $TaO_N$ (where N are suitable positive numbers for the respective compounds), or the like, or a suitable combination of the foregoing.

Conductive silicon-based bottom electrode 106 can comprise a silicon material, a silicon-compound (e.g., silicon germanium [SiGe]), or the like. The Si-based material employed for conductive silicon-based bottom electrode 106 can be doped with a suitable dopant. Moreover, in various embodiments, silicon based bottom electrode 106 can be doped with a p-type dopant that is activated upon depositing of the p-type dopant. In at least one embodiment, conductive silicon-based bottom electrode 106 can be formed with a vapor deposition process (e.g., chemical vapor deposition [CVD], low pressure chemical vapor deposition [LPCVD], and so on) in which a doped silicon-based layer is formed and activated concurrently.

In one or more embodiments, formation (e.g., depositing) of conductive silicon-based bottom electrode 106 can result in activation of a dopant and Si-based material of which conductive silicon-based material 106 is comprised. In various embodiments, the activation can be accomplished without an anneal process to activate the dopant. Activation often involves relatively high temperature (e.g., 750 degrees Celsius or more). In contrast, conductive silicon-based bottom electrode 106 can comprise depositing and activation at temperatures compatible with CMOS device fabrication, such as 450 degrees Celsius, or lower (e.g., in a range between about 410 degrees Celsius and about 450 degrees Celsius). Accordingly, memory cell 100 can be fabricated as part of a monolithic fabrication process with one or more CMOS devices (not depicted, but see, e.g., FIG. 2, infra). In one or more alternative or additional embodiments, depositing the p-type dopant can comprise providing a seed layer (not depicted, but see FIG. 3, infra). Further, in various embodiments, providing the seed layer can be a relatively low temperature process compatible with CMOS device fabrication (e.g., a process implemented at or below 450 degrees Celsius).

In various embodiments, one or more additional layers can be included as part of memory cell 100, though not specifically depicted as part of memory cell 100. For example, an intermediary layer(s) can be instituted adjacent to one or more of the layers depicted in FIG. 1. As one example, a suitable material layer that mitigates or controls unintended oxidation of switching layer 104 can be positioned between one or more layers of memory cell 100, such as between top electrode 102 and switching layer 104, or between silicon-based bottom electrode 106 and switching layer 104. As another example, top electrode 102 can include one or more additional layers (some relatively thin, e.g., 2 to 3 nm) such as Ti, TiN, W, etc., above top electrode 102 or between top electrode 102 and switching layer 104 as a barrier layer(s), or the like. In yet other embodiments, memory cell 100 can have fewer layers than depicted in FIG. 1. For instance, top electrode 102 can be removed and switching layer 104 can electrically contact a conductive wire (e.g., a bitline, a wordline, a select line, and so forth) of a memory device. Accordingly, it is to be appreciated that suitable variations of memory cell 100 known in the art or made known to one of ordinary skill in the art by way of the context provided herein are considered within the scope of the present disclosure.

Figure 2:
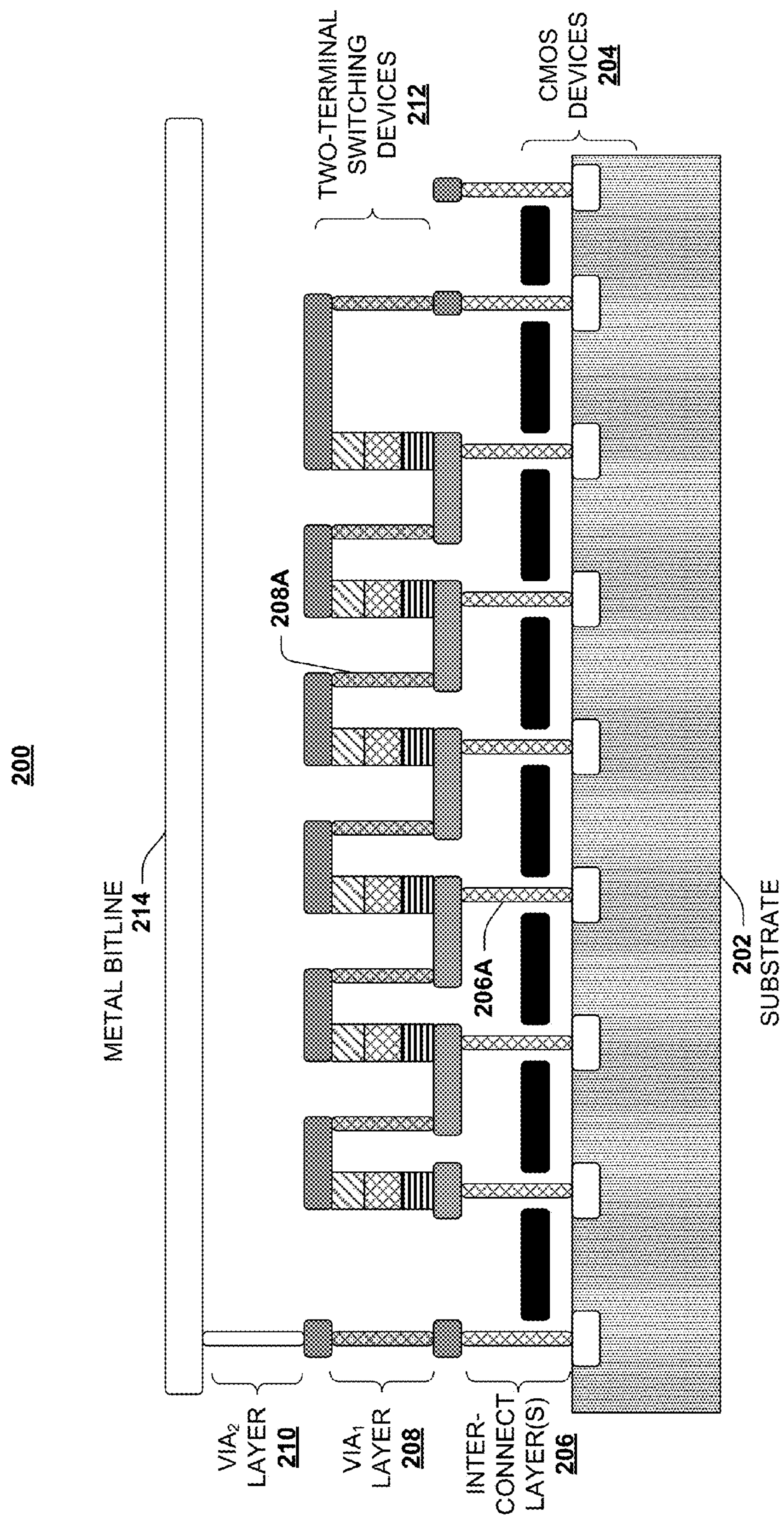
FIG. 2 depicts a block diagram of a cross-sectional view of a memory device comprising CMOS elements and two-terminal switching devices.

FIG. 2 illustrates a block diagram of an example memory device 200 comprising CMOS devices and conductive silicon-based components. As depicted, memory device 200 can comprise a substrate 202. Substrate 202 can be a silicon wafer, or other suitable semiconductor material utilized for fabrication of one or more CMOS devices 204 on, within or partially within substrate 202. In the example of FIG. 2, CMOS devices 204 can be at least in part formed within substrate 202. For instance, CMOS devices 204 can comprise one or more transistors having a source(s) or drain(s) contact formed within substrate 202. Additionally, the transistors can have one or more gates (e.g., a floating gate, etc.) formed above substrate 202.

One or more interconnect layers 206 can be formed to connect CMOS devices 204 with a set of two-terminal switching devices 212 (e.g., an array of two-terminal memory cells). Interconnect layers 206 can comprise metals having relatively low softening or melting temperatures, in some embodiments, such as Cu or Al, or the like. In alternative embodiments, interconnect layers 206 can comprise conductive silicon-based materials, such as a doped silicon conductive material as described herein. In addition, two-terminal switching devices 212 can comprise resistive-switching memory cells having one or more respective silicon-based conductive components, such as an electrode(s) (e.g., see memory cell 100 of FIG. 1, supra), as well as other respective layers (e.g., metal electrode(s), barrier layer(s), semi-conductive layer(s), ion migration layer(s), ion migration mitigating layer(s), and so on). Additionally, one or more via layers 208, 210 can connect a metal bitline 214, or a wordline, source line, etc. (not depicted), to components of CMOS devices 204 or two-terminal switching devices 212, as is known in the art or is made known to one of ordinary skill in the art by way of the context provided herein. Via layers 208, 210 can comprise a metal, a conductive silicon-based material, and so forth.

The inventors of the present disclosure understand that some conventional doping techniques for making silicon-based conductive materials involve quite high temperatures (e.g., 750 degrees Celsius, 900 degrees Celsius, 950 degrees Celsius, etc.). The inventors understand these high temperature processes are generally incompatible with conventional CMOS device fabrication utilizing metals such as Cu, Al, or the like, which have relatively low softening or melting temperatures (e.g., <700 degrees Celsius). Thus, the inventors understand that manufacture of memory device 200 could conventionally require non-monolithic processes, in which substrate 202 and CMOS devices 204 are formed separately from two-terminal switching devices 212. A non-monolithic process could involve, in the inventors' opinion, doping and activation of conductive silicon-based components of two-terminal switching devices 212, for instance, at suitably high temperatures separate from lower temperature components of CMOS devices 204 (or, for instance, of interconnect layer(s) 206, $via_1$ layer 208 or $via_2$ layer 210 were memory device to be created monolithically). CMOS devices 204 and two-terminal switching devices 212 could then be connected with interconnect layers 206, via layers 208, 210, and formation of metal bitline 214 (as well as wordlines, source lines, select lines, etc., which are not depicted at FIG. 2) at much lower temperatures. The inventors believe that non-monolithic fabrication can be much more complex, requiring higher costs, longer fabrication times, and greater overhead than a monolithic process, for instance.

In at least some disclosed embodiments, conductive silicon-based components of memory device 200 can be formed with low-temperature doping processes described herein. This can enable (e.g., in part or in whole) memory device 200 to be fabricated as a monolithic process, rather than a non-monolithic process (e.g., as described above). For instance, a conductive component of two-terminal switching devices 212, interconnect layer 206, metal bitline 214, or one or more of via layers 208, 210 can be formed in a range between about 410 degrees Celsius and about 450 degrees Celsius. In various embodiments, the conductive component(s) can be formed from a SiGe compound and a p-type dopant that is activated upon depositing the dopant within the SiGe compound. In some embodiments, the SiGe compound can be, e.g., $Si_XGe_YO_Z$, where X, Y, and Z are suitable integers. In alternative or additional embodiments, the p-type dopant can be Boron, or other suitable p-type dopant that is activated upon depositing the dopant and SiGe compound. According to one or more additional embodiments, a suitable low temperature seed layer can be utilized to facilitate depositing and activating the p-type dopant in the SiGe compound (e.g., see FIG. 3, infra). Accordingly, memory device 200 can be fabricated as a monolithic fabrication process utilizing a low temperature depositing and activation process described herein, significantly reducing overhead cost and complexity as compared with non-monolithic fabrication of CMOS devices 204 and two-terminal switching devices 212.

Figure 3:
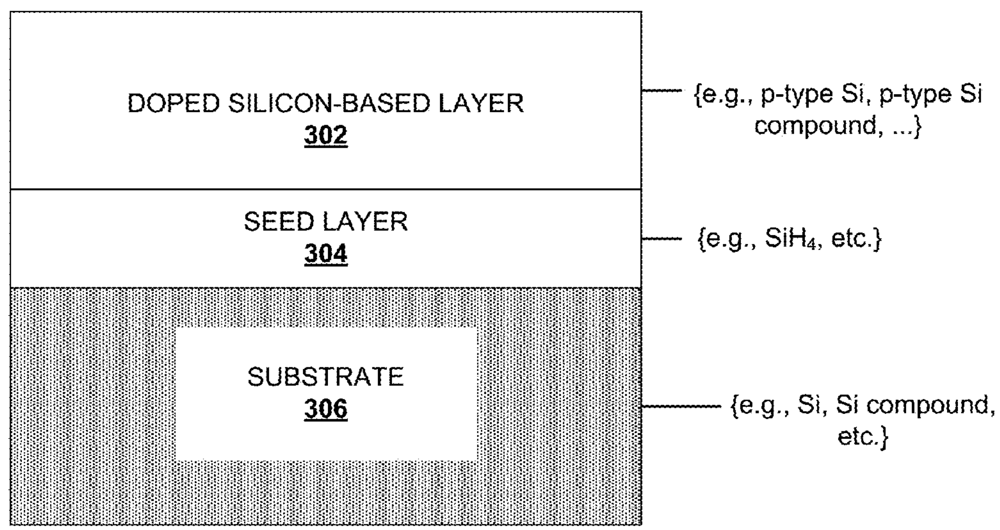
FIG. 3 depicts a block diagram of an example conductive silicon material doped with a relatively low temperature doping process.

FIG. 3 depicts a block diagram of a sample doped silicon material 300 configured for use in electronic memory, according to various aspects of the subject disclosure. Doped silicon conductor 300 can comprise a silicon substrate 306 suitable for formation of CMOS devices (e.g., transistors, switches, logic gates, interconnects, electronic sensors, and so on). A seed layer 304 can be provided to facilitate low-temperature activation of a doped silicon-based layer 306. For instance, doped silicon-based layer 306 can be formed at a temperature compatible with CMOS device fabrication (e.g., about 450 degrees Celsius or lower). In some embodiments, doped silicon-based layer 306 can be a silicon material comprising a suitable dopant. For instance, doped silicon-based layer 306 can be silicon, or a silicon compound. Suitable silicon compounds can comprise, for instance, SiGe or a SiGe compound (e.g., SiGeO, etc.), although other materials suitable for ion deposition and activation at temperatures compatible with CMOS device fabrication are considered within the scope of the subject disclosure.

Seed layer 304 can be provided to facilitate low temperature activation of conductive ions (e.g., p-type ions) within doped silicon-based layer 302. For instance, seed layer 304 can be configured to enhance nucleation of a dopant employed for doped silicon material 300, and configured to facilitate ion deposition at relatively low temperatures, such as those temperatures compatible with CMOS device fabrication. Accordingly, seed layer 304 can be provided to substrate 306 in-situ as part of a monolithic process that includes CMOS device fabrication and fabrication of doped silicon material 300 (e.g., see FIG. 2, infra, where doped silicon material 300 could be included as a conductive component—such as an electrode—of two-terminal switching devices 212, or as a conductive component of interconnect layer(s) 206, via layers 208, 210, metal bitline 214, and so forth). In at least one or more aspects of the subject disclosure, seed layer 304 can comprise a $SiH_4$ material. The inventors of the present disclosure have discovered that $SiH_4$ can provide a better seed layer for ion nucleation in a SiGe material at CMOS-compatible temperatures (e.g., about 450 degrees Celsius or below) than previously proposed materials. For instance, the inventors have discovered that a seed layer comprising disilane (e.g., $Si_2H_6$), although conventionally thought to have provided superior crystallization for a p-type dopant (e.g., boron) on an amorphous or crystalline silicon-based film, in fact provides a much poorer uniform resistivity as a function of depth for boron-doped SiGe as compared with a seed layer comprising $SiH_4$. (See, for example, FIG. 5, infra, depicting uniform resistivity of boron-doped SiGe at 430 degrees Celsius utilizing a $SiH_4$ seed layer.) Furthermore, the inventors believe that $SiH_4$ seed layer enhances crystallization and nucleation of doped SiGe compared with conventional techniques. Thus, according to these aspects of the subject disclosure, employing $SiH_4$ for seed layer 304 can facilitate relatively low temperature (e.g., <450 degrees Celsius) ion deposition and in-situ activation and conductivity of a doped base film, such as a boron-doped SiGe film.

In further embodiments, doped silicon-based layer 302 can be applied as a low pressure chemical vapor deposition (LPCVD) process. In alternative or additional embodiments, the doped silicon-based layer 302 can be a microcrystalline structure as-deposited. In at least one embodiment(s), doped silicon-based layer 302 can be a boron-doped SiGe film deposited using a LPCVD reactor at a temperature equal to or less than 450 degrees Celsius (e.g., within a range between about 410 degrees Celsius and about 450 degrees Celsius). In a further embodiment(s), doped silicon material 300 can be formed as part of a monolithic fabrication process for a CMOS device, in which doped silicon material 300 is an electrode or component of an electrode in a two-terminal memory device, a wiring material for the two-terminal memory device, a film applied to a metal wire (e.g., an Al wire, a Cu wire, etc.), or the like, or a suitable combination thereof.

FIG. 4 illustrates a table 400 of an example process(es) for providing in-situ deposition for fabricating a conductive SiGe film, according to additional embodiments of the subject disclosure. Table 400 includes sample in-situ doping parameters 402 for disclosed deposition processes. In addition, table 400 provides respective sample approximate values 404 and respective example approximate ranges 406 of values for the in-situ doping parameters 402. In at least one embodiment, the in-situ deposition can be performed with a LPCVD reactor. It should be appreciated that the parameters, values and ranges depicted in table 400 should not be interpreted as exhaustive; rather, other parameters, values and ranges suitable for providing in-situ deposition and activation of a p-type SiGe film are considered within the scope of the present disclosure.

As depicted, in-situ doping parameters 402 can include a chamber temperature having a sample temperature of about 430 degrees Celsius, and an example range of between about 410 and about 450 degrees Celsius. A chamber pressure, e.g., for deposition of a seed/nucleation film, can be about 400 milliTorr (mT), or in a range of between about 100 and about 800 mT. A seed material flow (e.g., for deposition of $SiH_4$ seed/nucleation film) can be about 50 standard cubic centimeters per minute (sccm), or in a range of between about 20 and about 300 sccm.

For deposition of a p-type SiGe film (e.g., a boron doped SiGe), a chamber pressure can be about 400 mT, or can be in a range between about 200 and about 800 mT. A seed material flow (e.g., $SiH_4$) provided for a p-type SiGe film deposition can be about 75 sccm, or can be in a range of between about 35 and about 150 sccm. A boron trichloride ($BCl_3$) flow for p-type SiGe film deposition can be about 30 sccm, or can be in a range of between about 15 and about 60 sccm. A germane ($GeH_4$) flow for the p-type SiGe film deposition can be about 250 sccm, or can be in a range of between about 100 and about 500 sccm.

Following deposition, verification of the film conductivity can be performed. Verification can be in terms of resistance, sheet Rho or sheet resistance, or a suitable combination thereof. A resistance value (in Ohms, e.g., measured by a 2-point probe) can be less than about 1000 ohms. A sheet Rho (in Ohms/sq; as measured by a 4-point probe) can be about 50 ohm/sq, or as large as about 250 ohm/sq. Furthermore, a sheet resistance (in Ohm-cm; for 3000 A° thick film) can be about 0.005 ohm-cm, or as large as about 0.01 ohm-cm.

Figure 5:
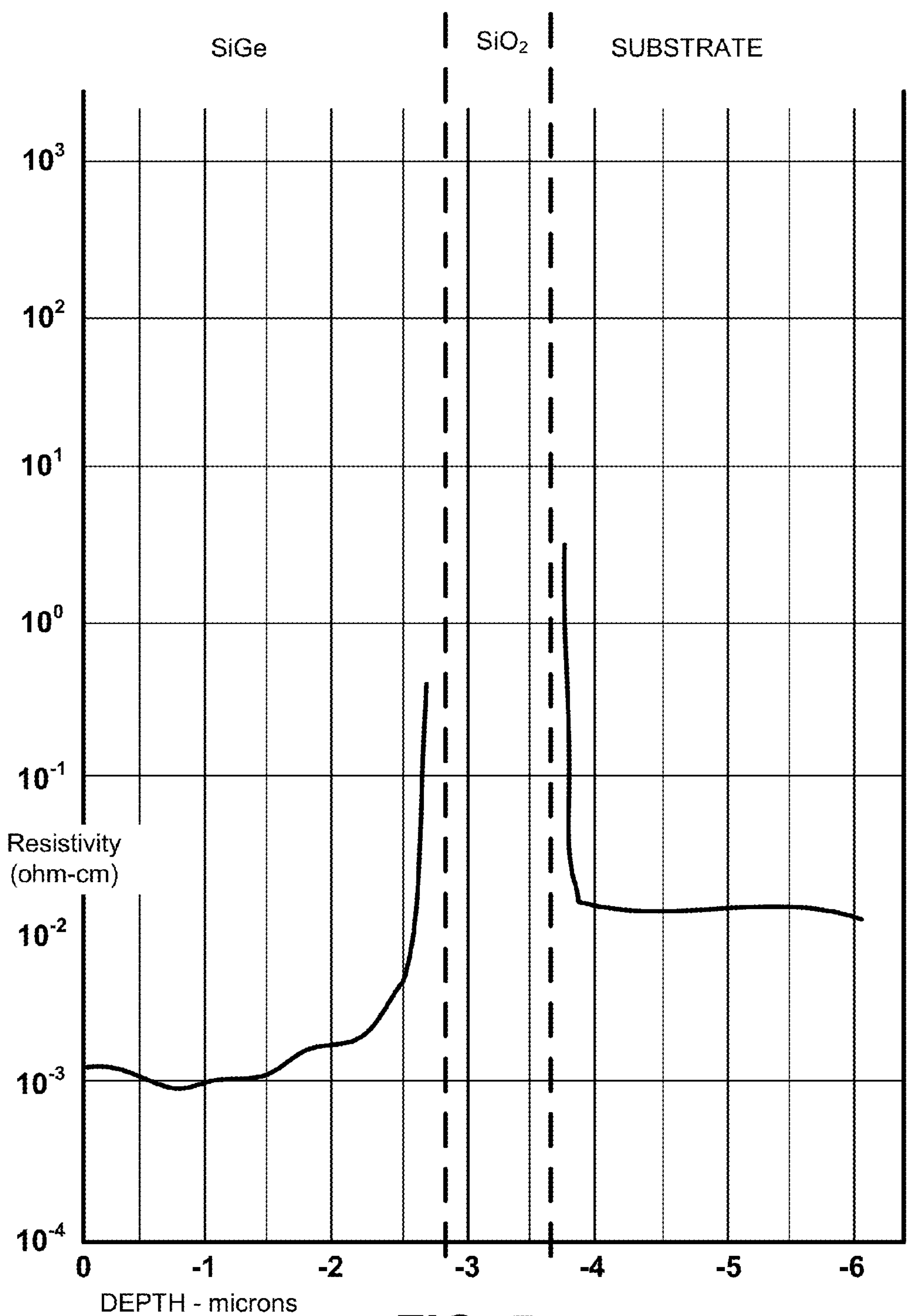
FIG. 5 depicts an example resistivity chart for a low temperature doped silicon based material according to embodiments of the subject disclosure.

FIG. 5 illustrates a diagram of an example graph 500 depicting a sheet resistance profile of a SiGe film prepared with a $SiH_4$ seed layer. The SiGe film was prepared at a temperature of 430 degrees Celsius, though other suitable temperatures can be employed. Graph 500 plots resistivity (in ohm-cm) on a vertical axis, against film depth (in microns) on a horizontal axis. The SiGe film includes a SiGe layer on a left side of the graph, at zero depth to just under three microns (left dashed vertical line), a $SiO_2$ layer in the middle of the graph (between the left dashed vertical line and a right dashed vertical line), and a silicon substrate from a depth just over three and a half microns to six microns in depth. As is depicted by graph 500, resistivity of the SiGe film is relatively flat for most of its depth, e.g., at or a bit above $10^{-3}$ ohm-cm.

The aforementioned diagrams have been described with respect to interaction between several components (e.g., layers) of a memory cell, a conductive layer thereof, or a memory architecture comprised of such memory cell/conductive layer. It should be appreciated that in some suitable alternative aspects of the subject disclosure, such diagrams can include those components and layers specified therein, some of the specified components/layers, or additional components/layers. Sub-components can also be implemented as electrically connected to other sub-components rather than included within a parent component/layer. For example, an intermediary layer(s) can be instituted adjacent to one or more of the disclosed layers. As one example, a suitable barrier layer that mitigates or controls unintended oxidation can be positioned between one or more disclosed layers. In yet other embodiments, a disclosed memory stack or set of film layers can have fewer layers than depicted. For instance, a switching layer can electrically contact a conductive wire directly, rather than having an electrode layer there between. Additionally, it is noted that one or more disclosed processes can be combined into a single process providing aggregate functionality. Components of the disclosed architectures can also interact with one or more other components not specifically described herein but known by those of skill in the art.

Figure 6:
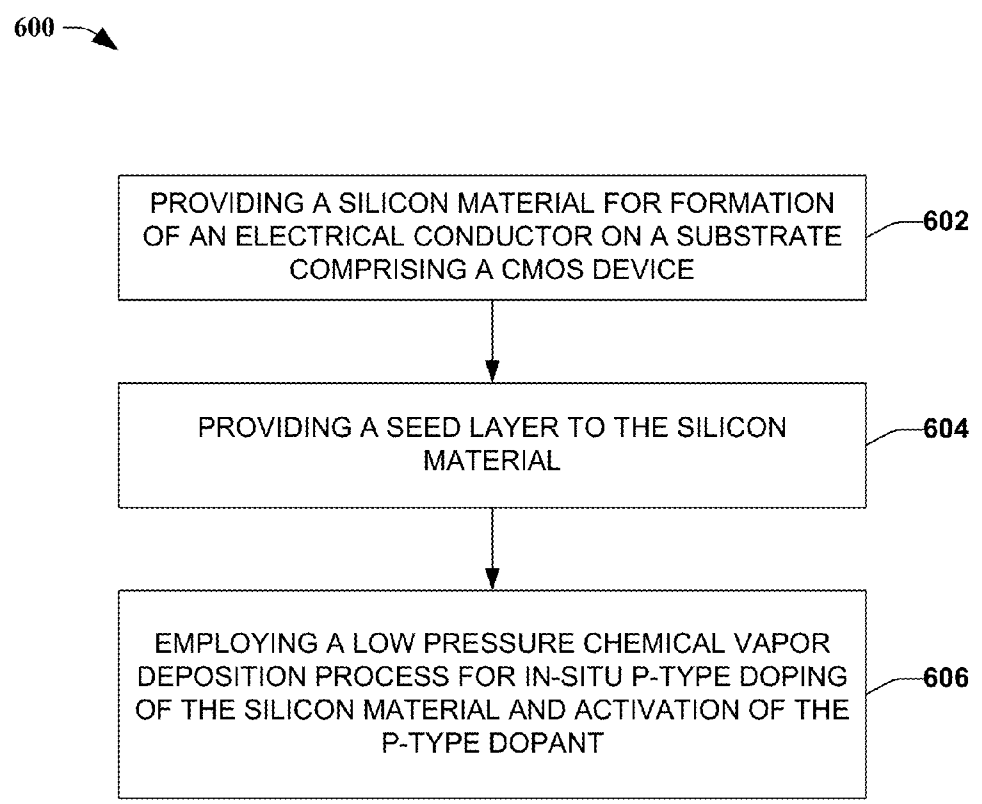
FIG. 6 depicts a flowchart of an example method for providing a relatively low temperature deposition of silicon based material, in further embodiments.

In view of the exemplary diagrams described supra, process methods that can be implemented in accordance with the disclosed subject matter will be better appreciated with reference to the flow chart of FIG. 6. While for purposes of simplicity of explanation, the method of FIG. 6 is shown and described as a series of blocks, it is to be understood and appreciated that the claimed subject matter is not limited by the order of the blocks, as some blocks may occur in different orders or concurrently with other blocks from what is depicted and described herein. Moreover, not all illustrated blocks are necessarily required to implement the methods described herein. Additionally, it should be further appreciated that the methods disclosed throughout this specification are capable of being stored on an article of manufacture to facilitate transporting and transferring such methodologies to an electronic device. The term article of manufacture, as used, is intended to encompass a computer program accessible from any computer-readable device, device in conjunction with a carrier, or storage medium.

FIG. 6 illustrates a flowchart of an example method 600 for providing in-situ deposition and activation of a silicon based conductor according to alternative or additional embodiments of the subject disclosure. At 602, method 600 can comprise providing a silicon substrate for formation of an electrical conductor. The substrate can comprise one or more CMOS devices, in some embodiments. In other embodiments, the silicon material can comprise silicon, a silicon compound (e.g., SiGe), or the like.

At 604, method 600 can comprise providing a seed layer over the substrate. In some embodiments, the seed layer can comprise a $SiH_4$ material at or below 450 degrees Celsius. Furthermore, the seed layer can be provided with a seed material flow between about 20 sccm and about 300 sccm. In at least one embodiment, the seed material flow can be about 50 sccm. In additional embodiments, LPCVD reactor pressure for providing the seed layer can be between about 100 mT and about 800 mT. As one example, the LPCVD reactor pressure can be about 400 mT.

At 606, method 600 can comprise providing a silicon material for formation of a silicon layer over the substrate. The silicon material can be a silicon compound, in some embodiments. In further embodiments, the silicon material can be SiGe, or a suitable SiGe compound (e.g., SiGeO). At 608, method 600 can comprise providing a p-type dopant with the silicon material for doping the silicon layer concurrent with forming the silicon layer as a conductive silicon layer.

In further embodiments, the silicon material and p-type dopant can be provided employing a LPCVD process for in-situ p-type deposition and activation of the silicon material. In some embodiments, activation can occur concurrent with deposition of the p-type dopant. In alternative or additional embodiments, the p-type dopant can be Boron, or another suitable dopant that is subject to activation as part of depositing the dopant. In further embodiments, an LPCVD chamber pressure for the deposition and activation can be in a range of about 200 mT and about 800 mT, and in one example the chamber pressure can be about 400 mT. According to alternative or additional embodiments, dopant material flow can be between about 15 sccm and about 60 sccm, and germane material flow can be between about 100 sccm and about 500 sccm.

Figure 7:
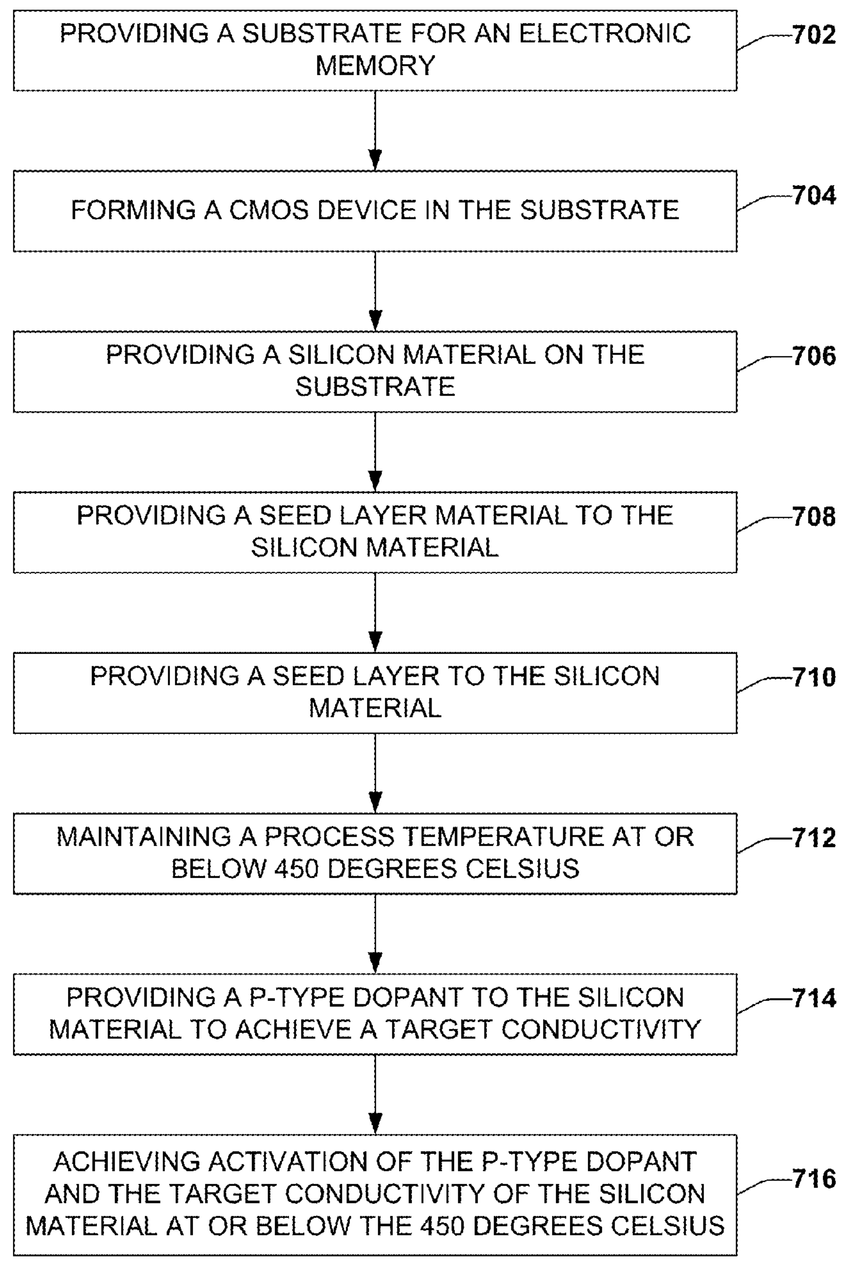
FIG. 7 illustrates a flowchart of a sample method for employing a seed layer to facilitate low temperature deposition of conductive silicon, in an embodiment(s).

FIG. 7 depicts a flowchart of a sample method 700 for fabrication of conductive silicon for an electronic device, according to alternative or additional aspects of the subject disclosure. At 702, method 700 can comprise providing a substrate for an electronic memory. The substrate can be a silicon or silicon compound, in various embodiments. At 704, method 700 can comprise forming a CMOS device in the substrate. At 706, method 700 can comprise providing a seed layer material on the substrate. In various embodiments, the seed layer material can be selected to facilitate in-situ activation of a p-type doped silicon or silicon compound employed for the conductive silicon. At 708, method 700 can comprise activating or maintaining a process temperature at or below 450 degrees Celsius for the fabrication of the conductive silicon. At 710, method 700 can comprise providing a silicon material for deposition on the substrate. At 712, method 700 can comprise providing a p-type dopant with the silicon material to achieve a target conductivity for the conductive silicon. At 714, method 700 can comprise achieving activation of the p-type dopant and the target conductivity of the silicon material at or below the 450 degrees Celsius.

Figure 8:
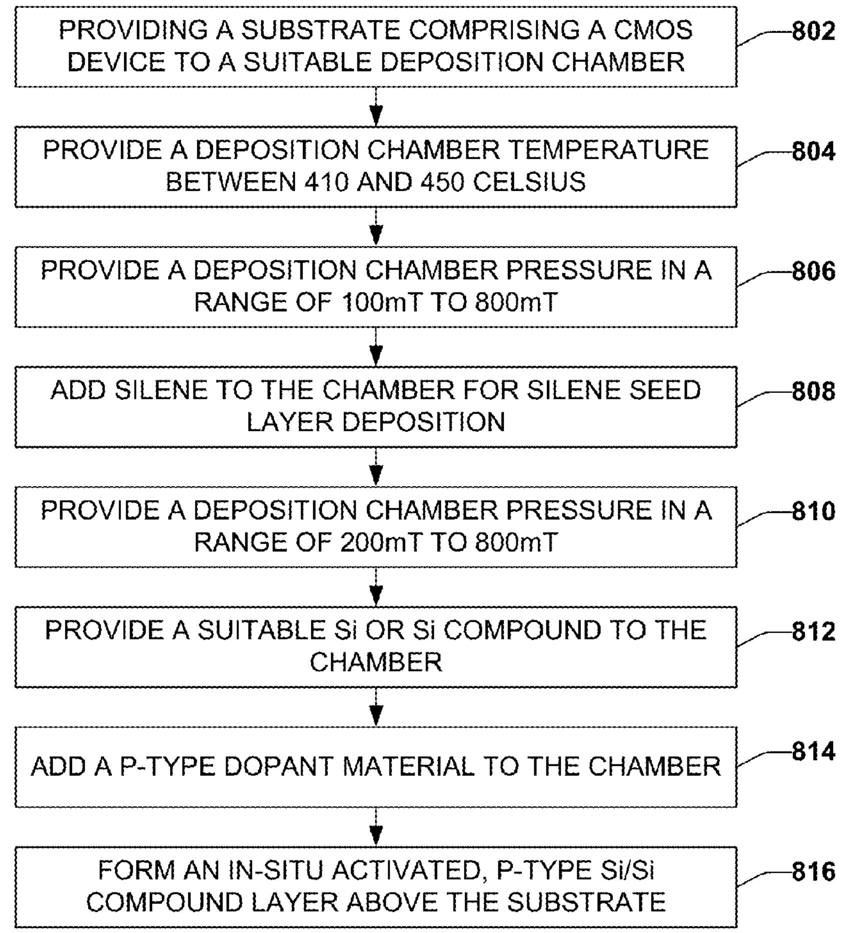
FIG. 8 depicts a flowchart of an example method for fabricating conductive silicon at CMOS-compatible operating temperature, in further embodiments.

FIG. 8 depicts a flowchart of a sample method 800 for fabricating conductive silicon for an electronic device, according to alternative or additional embodiments. At 802, method 800 can comprise providing a substrate comprising a CMOS device to a suitable deposition chamber. The deposition chamber can be a CVD processing chamber, in some embodiments. In other embodiments, the deposition chamber can be a LPCVD processing chamber.

At 804, method 800 can comprise providing a deposition chamber temperature between about 410 degrees Celsius, and about 450 degrees Celsius. At 806, method 800 can comprise providing a deposition chamber pressure in a range of about 100 mT and about 800 mT. At 808, method 800 can comprise adding silane to the chamber in conjunction with forming a silane seed layer on a subset of the substrate.

At 810, method 800 can comprise providing a deposition chamber pressure in a range between about 200 mT and about 800 mT. At 812, method 800 can comprise providing a suitable silicon or silicon compound to the chamber for deposition of a layer of the silicon or silicon compound onto at least a portion of the subset of the substrate. At 814, method 800 can comprise adding a p-type dopant material to the chamber. The p-type dopant can be selected to facilitate providing the layer of the silicon or silicon compound with a target conductivity. In some embodiments, the p-type dopant can be selected to be activated within the silicon or silicon compound in conjunction with the depositing (e.g., upon interacting with the silane seed layer).

Figure 9:
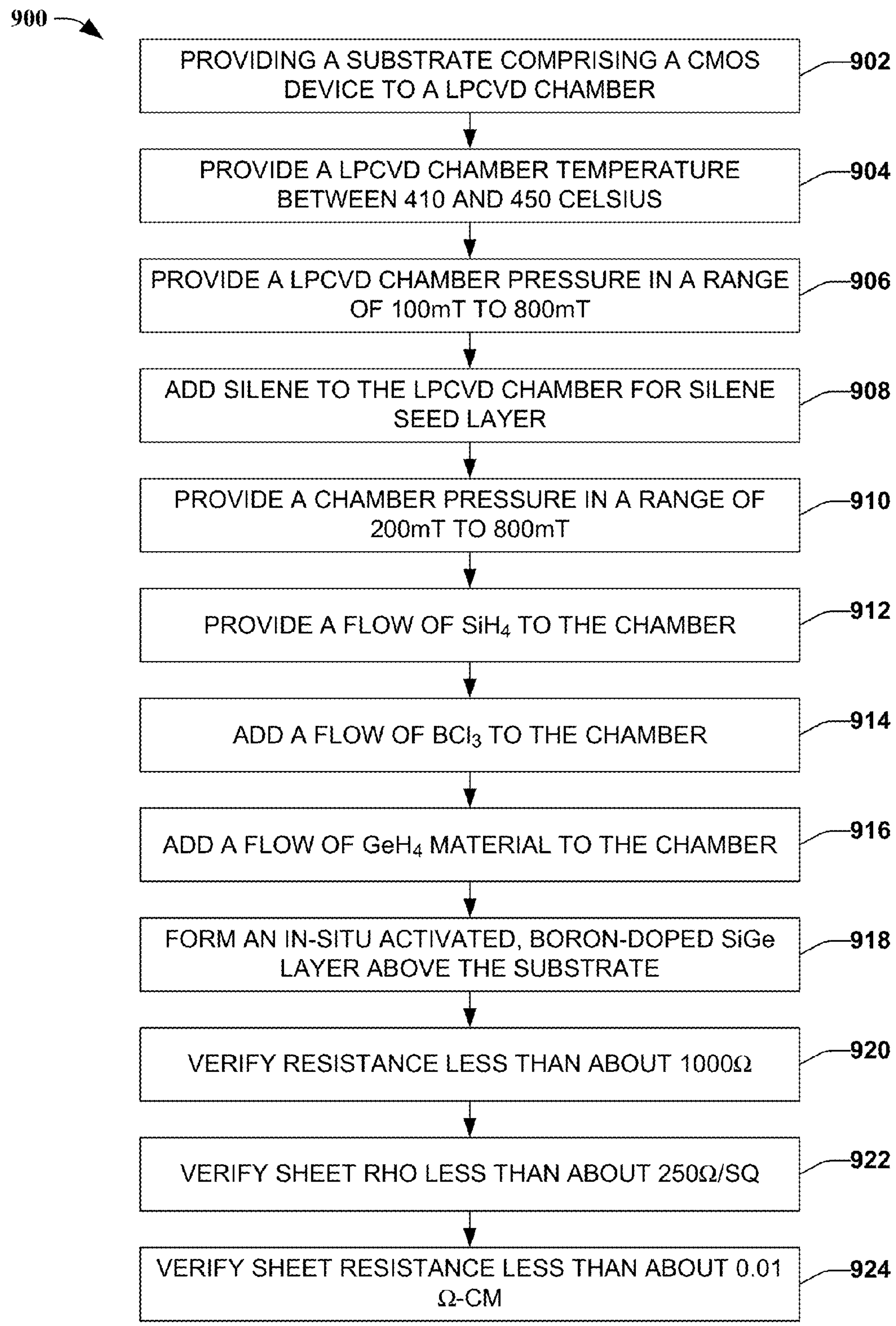
FIG. 9 illustrates a flowchart of a sample method for low temperature deposition of conductive silicon, in various embodiments.

FIG. 9 illustrates a flowchart of an example method 900 for fabricating conductive silicon, in one or more additional embodiments of the present disclosure. At 902, method 900 can comprise providing a substrate to a LPCVD chamber. In at least one embodiment, the substrate can comprise a CMOS device. At 904, method 900 can comprise providing a LPCVD chamber temperature between about 410 degrees Celsius and about 450 degrees Celsius. At 906, method 900 can comprise providing a LPCVD chamber pressure in a range between about 100 mT and about 800 mT. At 908, method 900 can comprise adding silane to the LPCVD chamber for a silane seed layer. In an embodiment, a material flow of silane can be in a range of about 20 sccm to about 300 sccm. In at least one embodiment, the material flow of silane can be about 50 sccm.

At 910, method 900 can comprise providing a chamber pressure in a range of about 200 mT and about 800 mT. At 912, method 900 can comprise providing a second flow of silane to the chamber. The second flow of silane can be in conjunction with depositing the conductive silicon. In various embodiments, the second flow of silane can be in a range between about 35 sccm and about 150 sccm. In at least one embodiment, the second flow of silane can be about 75 sccm.

At 914, method 900 can comprise adding a flow of $BCl_3$ to the chamber. The flow of $BCl_3$ can be in a range between about 15 sccm and about 60 sccm, in various embodiments. In at least one embodiment, the flow of $BCl_3$ can be about 30 sccm.

At 916, method 900 can comprise adding a flow of $GeH_4$ to the chamber. The flow of $GeH_4$ can be in a range between about 100 sccm and about 500 sccm, in further embodiments. According to another embodiment, the flow of $GeH_4$ can be about 250 sccm.

At 918, method 900 can comprise forming an in-situ activated, boron-doped SiGe layer above the substrate. At 920, method 900 can comprise verifying resistance of the boron-doped SiGe layer is less than about 1000 ohms (Ω). At 922, method 900 can comprise verifying sheet Rho of the boron-doped SiGe layer is less than about 250 Ω/sq. At 924, method 900 can comprise verifying sheet resistance of the boron-doped SiGe layer is less than about 0.01 Ω-cm.

Figure 10:
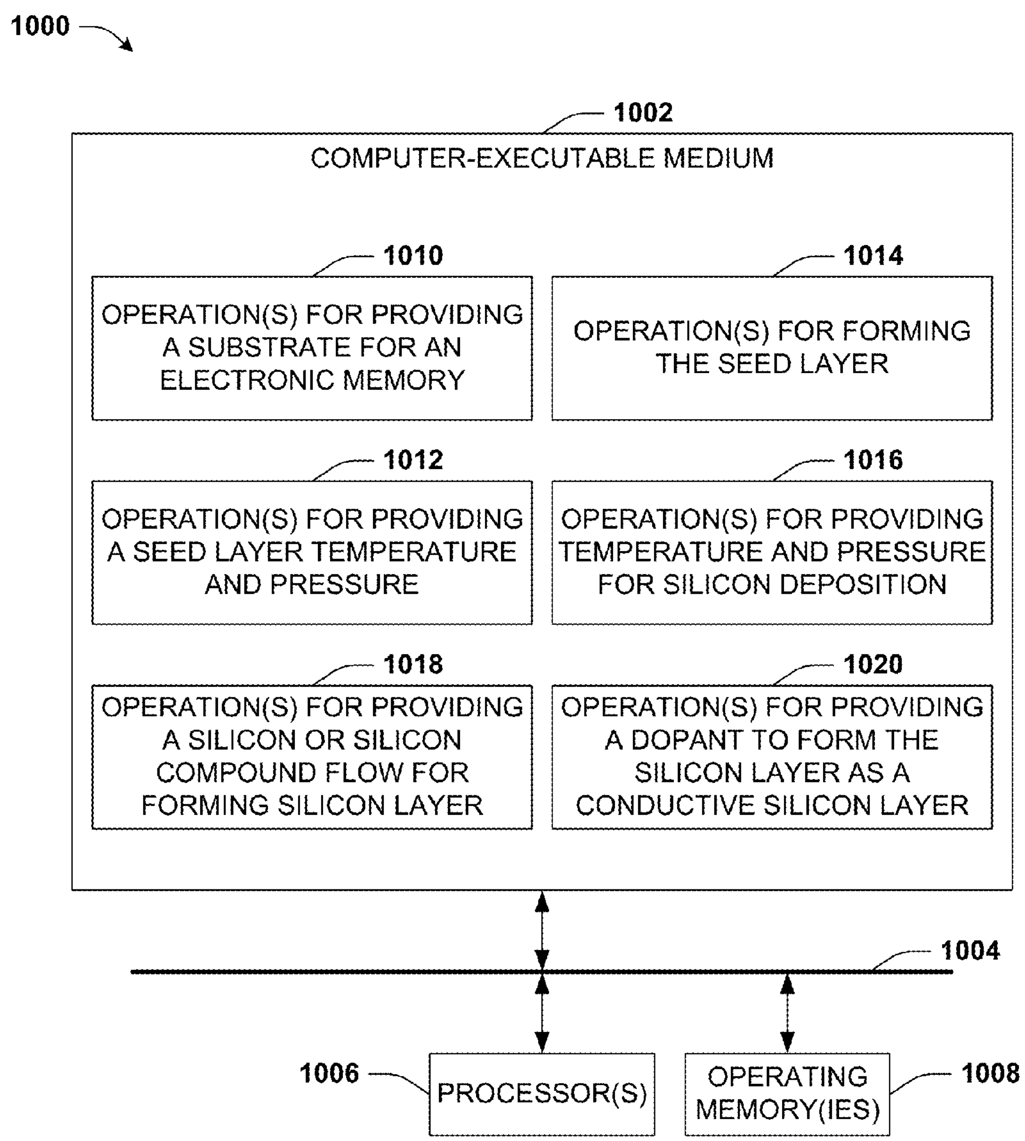
FIG. 10 depicts a block diagram of a sample electronic device facilitating implementation of various embodiments of the subject disclosure.

FIG. 10 illustrates a block diagram of an example electronic device 1000 for implementing one or more aspects of the subject disclosure. In various embodiments, electronic device 1000 can be configured for fabricating or facilitating fabrication of a two-terminal memory cell or a component thereof. In one embodiment, electronic device 1000 can be configured for providing in-situ activation and deposition of a conductive doped silicon material. For instance, electronic device 1000 can reside at least partially within a fabrication equipment, a memory, a memory module, a handheld computer, a personal computer, a networked computer, or the like. It is to be appreciated that apparatus 1000 is represented as including functional blocks, which can be functional blocks that represent functions implemented by a hardware, software, or combination thereof (e.g., firmware). In some aspects, the functional blocks can represent non-transitory computer-readable media. In other aspects, the functional blocks can represent transitory computer-readable media.

Electronic device 1000 can comprise an electronically executable component 1002 comprising stored operations that, once executed, facilitate the fabricating of a conductive silicon, and in-situ activation of a dopant within the conductive silicon. Electronically executable component 1002 can be operated, executed or accessed over a data communication interface 1004. Data communication interface 1004 can include a data bus, a dataline, a bitline, a wired or wireless communication interface, a network or network interface, or the like, or a suitable combination thereof. In at least one aspect of the subject disclosure, a subset of the stored operations for facilitating fabrication of the two-terminal memory cell can include computer-executable instructions stored in an operating memory(ies) 1008 or executed by a processor(s) 1006 to facilitate functionality of electronic device 1000. In another aspect, one or more of the stored operations can be replaced by one or more electrical, mechanical, or electro-mechanical means for executing the operations, in response to activation by a processor means or a mechanical automation means.

As depicted, electronically executable component 1002 can comprise operations 1010 for providing a substrate for an electronic memory device. The substrate can comprise a CMOS device in some embodiments; in other embodiments, operations 1010 can comprise operations for fabricating the CMOS device within the substrate. Further, electronically executable component 1002 can comprise operations 1012 for providing a seed layer temperature and pressure for facilitating provision of a seed layer to a subset of the substrate. Additionally, electronically executable component 1002 can comprise operations 1014 for forming the seed layer on the subset of the substrate. In additional embodiments, electronically executable component 1002 can comprise operations 1016 for providing temperature and pressure for silicon deposition. Electronically executable component 1002 can further comprise operations 1018 for providing a silicon or silicon compound flow for forming a silicon-based layer on a portion of the subset of the substrate. In addition, electronically executable component 1002 can comprise operations 1020 for providing a dopant to the silicon or silicon compound flow for providing a target conductivity for the silicon-based layer.

In various embodiments of the subject disclosure, disclosed memory architectures can be employed as a standalone or integrated embedded memory device with a CPU or microcomputer. Some embodiments can be implemented, for instance, as part of a computer memory (e.g., random access memory, cache memory, read-only memory, storage memory, or the like). Other embodiments can be implemented, for instance, as a portable memory device. Examples of suitable portable memory devices can include removable memory, such as a secure digital (SD) card, a universal serial bus (USB) memory stick, a compact flash (CF) card, or the like, or suitable combinations of the foregoing. (See, e.g., FIGS. 11 and 12, infra).

NAND FLASH is employed for compact FLASH devices, USB devices, SD cards, solid state drives (SSDs), and storage class memory, as well as other form-factors. Although NAND has proven a successful technology in fueling the drive to scale down to smaller devices and higher chip densities over the past decade, as technology scaled down past 25 nanometer (nm) memory cell technology, several structural, performance, and reliability problems became evident. A subset of these or similar considerations are addressed by the disclosed aspects.

Figure 11:
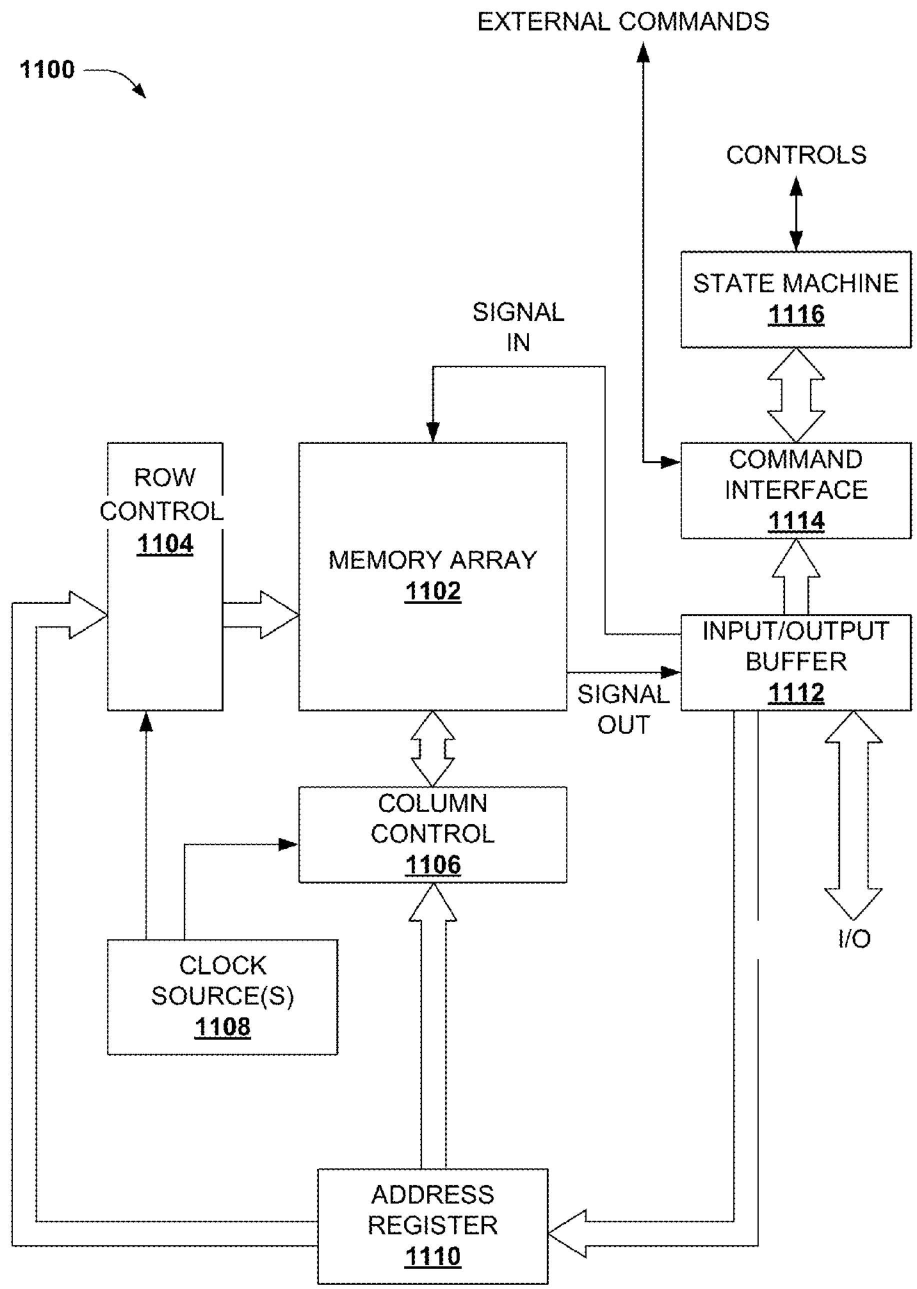
FIG. 11 illustrates a block diagram of a sample operating and control environment for a memory device according to various disclosed embodiments.

In order to provide a context for the various aspects of the disclosed subject matter, FIG. 11, as well as the following discussion, is intended to provide a brief, general description of a suitable environment in which various aspects of the disclosed subject matter can be implemented or processed. While the subject matter has been described above in the general context of semiconductor architectures and process methodologies for fabricating and operating such architectures, those skilled in the art will recognize that the subject disclosure also can be implemented in combination with other architectures or process methodologies. Moreover, those skilled in the art will appreciate that the disclosed processes can be practiced with a processing system or a computer processor, either alone or in conjunction with a host computer (e.g., computer 1102 of FIG. 11, infra), which can include single-processor or multiprocessor computer systems, mini-computing devices, mainframe computers, as well as personal computers, hand-held computing devices (e.g., PDA, smart phone, watch), microprocessor-based or programmable consumer or industrial electronics, and the like. The illustrated aspects may also be practiced in distributed computing environments where tasks are performed by remote processing devices that are linked through a communications network. However, some, if not all aspects of the subject innovation can be practiced on stand-alone electronic devices, such as a memory card, Flash memory module, removable memory, or the like. In a distributed computing environment, program modules can be located in both local and remote memory storage modules or devices.

FIG. 11 illustrates a block diagram of an example operating and control environment 1100 for a memory cell array 1102 according to aspects of the subject disclosure. In at least one aspect of the subject disclosure, memory cell array 1102 can comprise a variety of memory cell technology. In at least one embodiment, memory cells of the memory cell technology can comprise conductive silicon activated in-situ upon deposition, as described herein. In another embodiment, memory cell array 1102 can store operations configured to cause a device to fabricate conductive silicon activated in-situ upon deposition.

A column controller 1106 can be formed adjacent to memory cell array 1102. Moreover, column controller 1106 can be electrically coupled with bit lines of memory cell array 1102. Column controller 1106 can control respective bitlines, applying suitable program, erase or read voltages to selected bitlines.

In addition, operating and control environment 1100 can comprise a row controller 1104. Row controller 1104 can be formed adjacent to column controller 1106, and electrically connected with word lines of memory cell array 1102. Row controller 1104 can select particular rows of memory cells with a suitable selection voltage. Moreover, row controller 1104 can facilitate program, erase or read operations by applying suitable voltages at selected word lines.

A clock source(s) 1108 can provide respective clock pulses to facilitate timing for read, write, and program operations of row controller 1104 and column controller 1106. Clock source(s) 1108 can further facilitate selection of word lines or bit lines in response to external or internal commands received by operating and control environment 1100. An input/output buffer 1112 can be connected to an external host apparatus, such as a computer or other processing device (not depicted, but see e.g., computer 802 of FIG. 12, infra) by way of an I/O buffer or other I/O communication interface. Input/output buffer 1112 can be configured to receive write data, receive an erase instruction, output readout data, and receive address data and command data, as well as address data for respective instructions. Address data can be transferred to row controller 1104 and column controller 1106 by an address register 1110. In addition, input data is transmitted to memory cell array 1102 via signal input lines, and output data is received from memory cell array 1102 via signal output lines. Input data can be received from the host apparatus, and output data can be delivered to the host apparatus via the I/O buffer.

Commands received from the host apparatus can be provided to a command interface 1114. Command interface 1114 can be configured to receive external control signals from the host apparatus, and determine whether data input to the input/output buffer 1112 is write data, a command, or an address. Input commands can be transferred to a state machine 1116.

State machine 1116 can be configured to manage programming and reprogramming of memory cell array 1102. State machine 1116 receives commands from the host apparatus via input/output buffer 1112 and command interface 1114, and manages read, write, erase, data input, data output, and similar functionality associated with memory cell array 1102. In some aspects, state machine 1116 can send and receive acknowledgments and negative acknowledgments regarding successful receipt or execution of various commands.

To implement read, write, erase, input, output, etc., functionality, state machine 1116 can control clock source(s) 1108. Control of clock source(s) 1108 can cause output pulses configured to facilitate row controller 1104 and column controller 1106 implementing the particular functionality. Output pulses can be transferred to selected bit lines by column controller 1106, for instance, or word lines by row controller 1104, for instance.

In connection with FIG. 12, the systems and processes described below can be embodied within hardware, such as a single integrated circuit (IC) chip, multiple ICs, an application specific integrated circuit (ASIC), or the like. Further, the order in which some or all of the process blocks appear in each process should not be deemed limiting. Rather, it should be understood that some of the process blocks can be executed in a variety of orders, not all of which may be explicitly illustrated herein.

Figure 12:
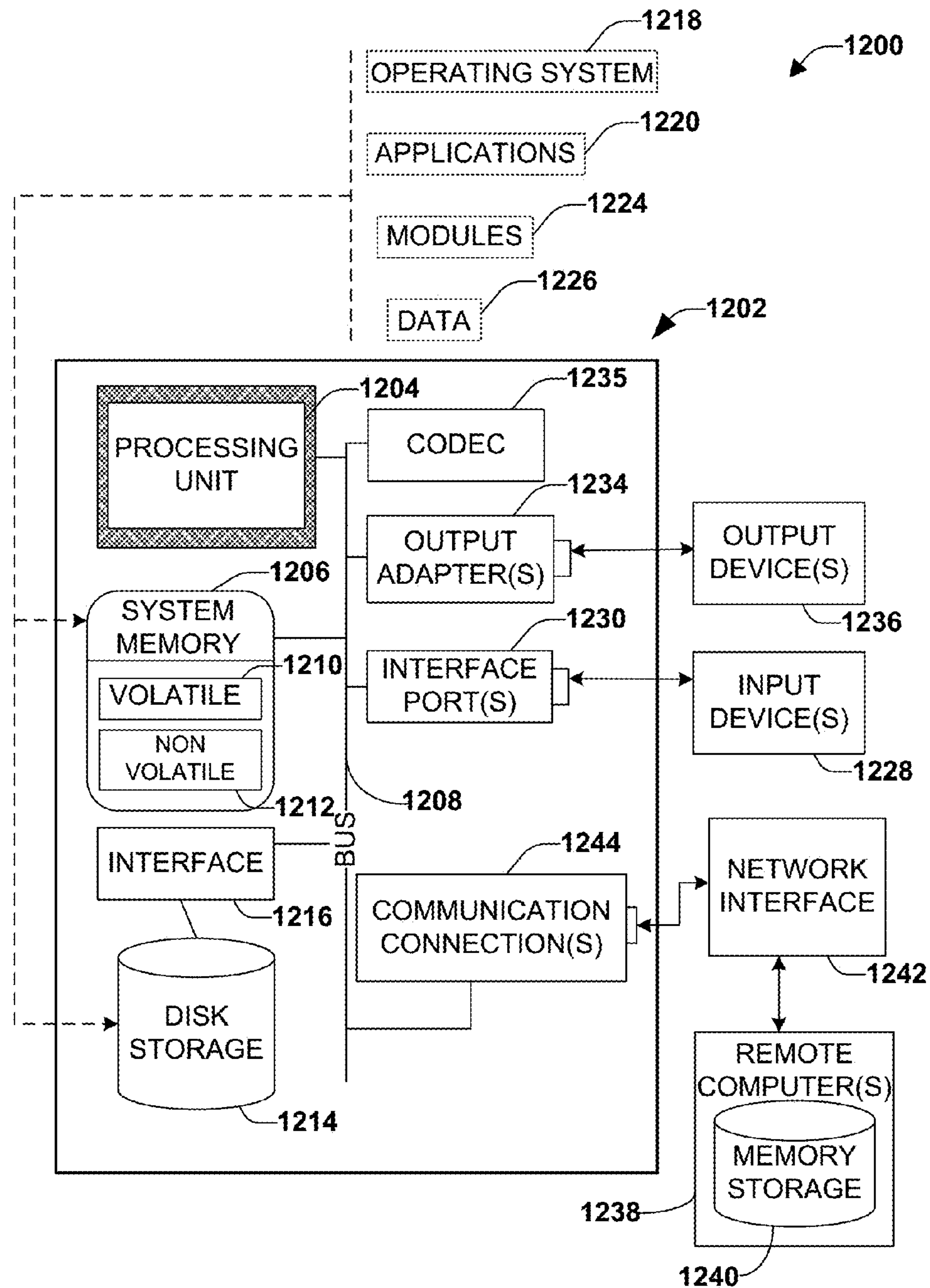
FIG. 12 illustrates a block diagram of an example computing environment that can be implemented in conjunction with various embodiments.

With reference to FIG. 12, a suitable operating environment 1200 for implementing various aspects of the claimed subject matter includes a computer 1202. The computer 1202 includes a processing unit 1204, a system memory 1206, a codec 1235, and a system bus 1208. The system bus 1208 couples system components including, but not limited to, the system memory 1206 to the processing unit 1204. The processing unit 1204 can be any of various available processors. Dual microprocessors and other multiprocessor architectures also can be employed as the processing unit 1204.

The system bus 1208 can be any of several types of bus structure(s) including the memory bus or memory controller, a peripheral bus or external bus, and/or a local bus using any variety of available bus architectures including, but not limited to, Industrial Standard Architecture (ISA), Micro-Channel Architecture (MSA), Extended ISA (EISA), Intelligent Drive Electronics (IDE), VESA Local Bus (VLB), Peripheral Component Interconnect (PCI), Card Bus, Universal Serial Bus (USB), Advanced Graphics Port (AGP), Personal Computer Memory Card International Association bus (PCMCIA), Firewire (IEEE 1394), and Small Computer Systems Interface (SCSI).

The system memory 1206 includes volatile memory 1210 and non-volatile memory 1212, which can employ one or more of the disclosed memory architectures, in various embodiments. The basic input/output system (BIOS), containing the basic routines to transfer information between elements within the computer 1202, such as during start-up, is stored in non-volatile memory 1212. In addition, according to present innovations, codec 1235 may include at least one of an encoder or decoder, wherein the at least one of an encoder or decoder may consist of hardware, software, or a combination of hardware and software. Although, codec 1235 is depicted as a separate component, codec 1235 may be contained within non-volatile memory 1212. By way of illustration, and not limitation, non-volatile memory 1212 can include read only memory (ROM), programmable ROM (PROM), electrically programmable ROM (EPROM), electrically erasable programmable ROM (EEPROM), or Flash memory. Non-volatile memory 1212 can employ one or more of the disclosed memory architectures, in at least some disclosed embodiments. Moreover, non-volatile memory 1212 can be computer memory (e.g., physically integrated with computer 1202 or a mainboard thereof), or removable memory. Examples of suitable removable memory with which disclosed embodiments can be implemented can include a secure digital (SD) card, a compact Flash (CF) card, a universal serial bus (USB) memory stick, or the like. Volatile memory 1210 includes random access memory (RAM), which acts as external cache memory, and can also employ one or more disclosed memory architectures in various embodiments. By way of illustration and not limitation, RAM is available in many forms such as static RAM (SRAM), dynamic RAM (DRAM), synchronous DRAM (SDRAM), double data rate SDRAM (DDR SDRAM), and enhanced SDRAM (ESDRAM), and so forth.

Computer 1202 may also include removable/non-removable, volatile/non-volatile computer storage medium. FIG. 12 illustrates, for example, disk storage 1214. Disk storage 1214 includes, but is not limited to, devices such as a magnetic disk drive, solid state disk (SSD) floppy disk drive, tape drive, Jaz drive, Zip drive, LS-100 drive, flash memory card, or memory stick. In addition, disk storage 1214 can include storage medium separately or in combination with other storage medium including, but not limited to, an optical disk drive such as a compact disk ROM device (CD-ROM), CD recordable drive (CD-R Drive), CD rewritable drive (CD-RW Drive) or a digital versatile disk ROM drive (DVD-ROM). To facilitate connection of the disk storage 1214 to the system bus 1208, a removable or non-removable interface is typically used, such as interface 1216. It is appreciated that disk storage 1214 can store information related to a user. Such information might be stored at or provided to a server or to an application running on a user device. In one embodiment, the user can be notified (e.g., by way of output device(s) 1236) of the types of information that are stored to disk storage 1214 and/or transmitted to the server or application, The user can be provided the opportunity to opt-in or opt-out of having such information collected and/or shared with the server or application (e.g., by way of input from input device(s) 1228).

It is to be appreciated that FIG. 12 describes software that acts as an intermediary between users and the basic computer resources described in the suitable operating environment 1200. Such software includes an operating system 1218. Operating system 1218, which can be stored on disk storage 1214, acts to control and allocate resources of the computer 1202. Applications 1220 take advantage of the management of resources by operating system 1218 through program modules 1224, and program data 1226, such as the boot/shutdown transaction table and the like, stored either in system memory 1206 or on disk storage 1214. It is to be appreciated that the claimed subject matter can be implemented with various operating systems or combinations of operating systems.

A user enters commands or information into the computer 1202 through input device(s) 1228. Input devices 1228 include, but are not limited to, a pointing device such as a mouse, trackball, stylus, touch pad, keyboard, microphone, joystick, game pad, satellite dish, scanner, TV tuner card, digital camera, digital video camera, web camera, and the like. These and other input devices connect to the processing unit 1204 through the system bus 1208 via interface port(s) 1230. Interface port(s) 1230 include, for example, a serial port, a parallel port, a game port, and a universal serial bus (USB). Output device(s) 1236 use some of the same type of ports as input device(s) 1228. Thus, for example, a USB port may be used to provide input to computer 1202 and to output information from computer 1202 to an output device 1236. Output adapter 1234 is provided to illustrate that there are some output devices, such as monitors, speakers, and printers, among other output devices, which require special adapters. The output adapter 1234 can include, by way of illustration and not limitation, video and sound cards that provide a means of connection between the output device 1236 and the system bus 1208. It should be noted that other devices and/or systems of devices provide both input and output capabilities such as remote computer(s) 1238.

Computer 1202 can operate in a networked environment using logical connections to one or more remote computers, such as remote computer(s) 1238. The remote computer(s) 1238 can be a personal computer, a server, a router, a network PC, a workstation, a microprocessor based appliance, a peer device, a smart phone, a tablet, or other network node, and typically includes many of the elements described relative to computer 1202. For purposes of brevity, only a memory storage device 1240 is illustrated with remote computer(s) 1238. Remote computer(s) 1238 is logically connected to computer 1202 through a network interface 1242 and then connected via communication connection(s) 1244. Network interface 1242 encompasses wire and/or wireless communication networks such as local-area networks (LAN) and wide-area networks (WAN) and cellular networks. LAN technologies include Fiber Distributed Data Interface (FDDI), Copper Distributed Data Interface (CDDI), Ethernet, Token Ring and the like. WAN technologies include, but are not limited to, point-to-point links, circuit switching networks such as Integrated Services Digital Networks (ISDN) and variations thereon, packet switching networks, and Digital Subscriber Lines (DSL).

Communication connection(s) 1244 refers to the hardware/software employed to connect the network interface 1242 to the system bus 1208. While communication connection 1244 is shown for illustrative clarity inside computer 1202, it can also be external to computer 1202. The hardware/software necessary for connection to the network interface 1242 includes, for exemplary purposes only, internal and external technologies such as, modems including regular telephone grade modems, cable modems and DSL modems, ISDN adapters, and wired and wireless Ethernet cards, hubs, and routers.

The illustrated aspects of the disclosure may also be practiced in distributed computing environments where certain tasks are performed by remote processing devices that are linked through a communications network. In a distributed computing environment, program modules or stored information, instructions, or the like can be located in local or remote memory storage devices.

Moreover, it is to be appreciated that various components described herein can include electrical circuit(s) that can include components and circuitry elements of suitable value in order to implement the embodiments of the subject disclosure. Furthermore, it can be appreciated that many of the various components can be implemented on one or more IC chips. For example, in one embodiment, a set of components can be implemented in a single IC chip. In other embodiments, one or more of respective components are fabricated or implemented on separate IC chips.

As utilized herein, terms "component," "system," "architecture" and the like are intended to refer to a computer or electronic-related entity, either hardware, a combination of hardware and software, software (e.g., in execution), or firmware. For example, a component can be one or more transistors, a memory cell, an arrangement of transistors or memory cells, a gate array, a programmable gate array, an application specific integrated circuit, a controller, a processor, a process running on the processor, an object, executable, program or application accessing or interfacing with semiconductor memory, a computer, or the like, or a suitable combination thereof. The component can include erasable programming (e.g., process instructions at least in part stored in erasable memory) or hard programming (e.g., process instructions burned into non-erasable memory at manufacture).

By way of illustration, both a process executed from memory and the processor can be a component. As another example, an architecture can include an arrangement of electronic hardware (e.g., parallel or serial transistors), processing instructions and a processor, which implement the processing instructions in a manner suitable to the arrangement of electronic hardware. In addition, an architecture can include a single component (e.g., a transistor, a gate array, . . . ) or an arrangement of components (e.g., a series or parallel arrangement of transistors, a gate array connected with program circuitry, power leads, electrical ground, input signal lines and output signal lines, and so on). A system can include one or more components as well as one or more architectures. One example system can include a switching block architecture comprising crossed input/output lines and pass gate transistors, as well as power source(s), signal generator(s), communication bus(ses), controllers, I/O interface, address registers, and so on. It is to be appreciated that some overlap in definitions is anticipated, and an architecture or a system can be a stand-alone component, or a component of another architecture, system, etc.

In addition to the foregoing, the disclosed subject matter can be implemented as a method, apparatus, or article of manufacture using typical manufacturing, programming or engineering techniques to produce hardware, firmware, software, or any suitable combination thereof to control an electronic device to implement the disclosed subject matter. The terms "apparatus" and "article of manufacture" where used herein are intended to encompass an electronic device, a semiconductor device, a computer, or a computer program accessible from any computer-readable device, carrier, or media. Computer-readable media can include hardware media, or software media. In addition, the media can include non-transitory media, or transport media. In one example, non-transitory media can include computer readable hardware media. Specific examples of computer readable hardware media can include but are not limited to magnetic storage devices (e.g., hard disk, floppy disk, magnetic strips . . . ), optical disks (e.g., compact disk (CD), digital versatile disk (DVD) . . . ), smart cards, and flash memory devices (e.g., card, stick, key drive . . . ). Computer-readable transport media can include carrier waves, or the like. Of course, those skilled in the art will recognize many modifications can be made to this configuration without departing from the scope or spirit of the disclosed subject matter.

What has been described above includes examples of the subject innovation. It is, of course, not possible to describe every conceivable combination of components or methodologies for purposes of describing the subject innovation, but one of ordinary skill in the art can recognize that many further combinations and permutations of the subject innovation are possible. Accordingly, the disclosed subject matter is intended to embrace all such alterations, modifications and variations that fall within the spirit and scope of the disclosure. Furthermore, to the extent that a term "includes", "including", "has" or "having" and variants thereof is used in either the detailed description or the claims, such term is intended to be inclusive in a manner similar to the term "comprising" as "comprising" is interpreted when employed as a transitional word in a claim.

Moreover, the word "exemplary" is used herein to mean serving as an example, instance, or illustration. Any aspect or design described herein as "exemplary" is not necessarily to be construed as preferred or advantageous over other aspects or designs. Rather, use of the word exemplary is intended to present concepts in a concrete fashion. As used in this application, the term "or" is intended to mean an inclusive "or" rather than an exclusive "or". That is, unless specified otherwise, or clear from context, "X employs A or B" is intended to mean any of the natural inclusive permutations. That is, if X employs A; X employs B; or X employs both A and B, then "X employs A or B" is satisfied under any of the foregoing instances. In addition, the articles "a" and "an" as used in this application and the appended claims should generally be construed to mean "one or more" unless specified otherwise or clear from context to be directed to a singular form.

Additionally, some portions of the detailed description have been presented in terms of algorithms or process operations on data bits within electronic memory. These process descriptions or representations are mechanisms employed by those cognizant in the art to effectively convey the substance of their work to others equally skilled. A process is here, generally, conceived to be a self-consistent sequence of acts leading to a desired result. The acts are those requiring physical manipulations of physical quantities. Typically, though not necessarily, these quantities take the form of electrical and/or magnetic signals capable of being stored, transferred, combined, compared, and/or otherwise manipulated.

It has proven convenient, principally for reasons of common usage, to refer to these signals as bits, values, elements, symbols, characters, terms, numbers, or the like. It should be borne in mind, however, that all of these and similar terms are to be associated with the appropriate physical quantities and are merely convenient labels applied to these quantities.

Unless specifically stated otherwise or apparent from the foregoing discussion, it is appreciated that throughout the disclosed subject matter, discussions utilizing terms such as processing, computing, replicating, mimicking, determining, or transmitting, and the like, refer to the action and processes of processing systems, and/or similar consumer or industrial electronic devices or machines, that manipulate or transform data or signals represented as physical (electrical or electronic) quantities within the circuits, registers or memories of the electronic device(s), into other data or signals similarly represented as physical quantities within the machine or computer system memories or registers or other such information storage, transmission and/or display devices.

In regard to the various functions performed by the above described components, architectures, circuits, processes and the like, the terms (including a reference to a "means") used to describe such components are intended to correspond, unless otherwise indicated, to any component which performs the specified function of the described component (e.g., a functional equivalent), even though not structurally equivalent to the disclosed structure, which performs the function in the herein illustrated exemplary aspects of the embodiments. In addition, while a particular feature may have been disclosed with respect to only one of several implementations, such feature may be combined with one or more other features of the other implementations as may be desired and advantageous for any given or particular application. It will also be recognized that the embodiments include a system as well as a computer-readable medium having computer-executable instructions for performing the acts and/or events of the various processes.

What is claimed is:

1. A memory cell, comprising:

a first electrode comprising a seed layer configured to facilitate activation of a doped semiconductor material;

a switching layer positioned adjacent the first electrode, and configured to switch from a first state to a second state in response to a first signal applied to the memory cell and further configured to switch from the second state to the first state in response to a second signal applied to the memory cell; and a second electrode adjacent the switching layer;

wherein the first electrode further comprises a conductive p-type doped silicon compound that is activated, via the seed layer, at a temperature less than or equal to about 450 degrees Celsius during formation of the first electrode.

2. The memory cell of claim 1, further comprising one or more barrier layers disposed between the switching layer and the first electrode or the second electrode, wherein the one or more barrier layers are configured to mitigate oxidation of the switching layer.

3. The memory cell of claim 2, wherein the one or more barrier layers are selected from a group consisting of: Ti, TiN, and W.

4. The memory cell of claim 1, wherein the conductive p-type doped silicon compound is formed at least in part utilizing the seed layer.

5. The memory cell of claim 4, wherein the seed layer is configured to facilitate concurrent depositing and activation of a p-type dopant.

6. The memory cell of claim 5, wherein the seed layer comprises a SiGe compound.

7. The memory cell of claim 5, wherein the conductive p-type doped silicon compound is subjected to a temperature less than about 450 degrees Celsius.

8. The memory cell of claim 5, wherein the p-type doped silicon compound comprises a SiGe compound.

9. The memory cell of claim 1, further comprising a substrate having a complementary metal oxide semiconductor (CMOS) circuit formed at least in part thereon.

10. The memory cell of claim 8, wherein the seed layer is configured to facilitate crystallization of the p-type doped silicon compound.

11. The memory cell of claim 1, wherein a barrier layer of the one or more barrier layers has a thickness in a range from about 20 Å to about 30 Å.

12. The memory cell of claim 1, wherein the seed layer comprises a silane layer.

13. The memory cell of claim 12, wherein the silane layer is configured to facilitate ion nucleation in a conductive p-type doped silicon compound at a temperature less than about 450 degrees Celsius.

14. The memory cell of claim 8, wherein the SiGe compound comprises a boron trichloride deposition material that is activated within the SiGe compound concurrent to deposition.

15. The memory cell of claim 8, wherein the seed layer comprises a silane layer, and wherein the SiGe compound is subjected to a temperature of about 430 degrees Celsius.

16. The memory cell of claim 8, wherein the seed layer comprises a silane layer, and wherein the SiGe compound is subjected to a temperature of about 410 degrees Celsius.

17. The memory cell of claim 5, wherein the p-type dopant comprises a boron trichloride deposition material.

18. The memory cell of claim 9, wherein the conductive p-type doped silicon compound forms a portion of an interconnect between the CMOS circuit and the memory cell.

19. The memory cell of claim 9, wherein the conductive p-type doped silicon compound forms a portion of a via layer that connects the CMOS circuit to a metal wire.

20. The memory cell of claim 9, wherein the conductive p-type doped silicon compound forms an electrical connection between the CMOS circuit and a conductive wire of a memory device comprising the memory cell.

* * * * *